United States Patent [19]

Nakao et al.

[11] Patent Number: 4,737,902
[45] Date of Patent: Apr. 12, 1988

[54] INNER POTENTIAL GENERATING CIRCUIT

[75] Inventors: Yoshiharu Nakao; Youichi Tobita, both of Hyogo, Japan

[73] Assignee: Mitsubishi Denki Kabushiki Kaisha, Tokyo, Japan

[21] Appl. No.: 15,354

[22] Filed: Feb. 17, 1987

[30] Foreign Application Priority Data

Feb. 24, 1986 [JP] Japan .................................. 61-40617

[51] Int. Cl.$^4$ ............................................ H02M 7/217
[52] U.S. Cl. ........................................ 363/127; 363/61
[58] Field of Search ............................. 363/127, 61, 62

[56] References Cited

U.S. PATENT DOCUMENTS 4,127,895 11/1978 Krueger ............................. 363/62 X
4,280,175 7/1981 Leuthold ............................. 363/127
4,298,926 11/1981 Black ................................ 363/61 X

FOREIGN PATENT DOCUMENTS 78165 5/1982 Japan .
59-56870 4/1984 Japan ................................ 363/127

Primary Examiner—Patrick R. Salce
Assistant Examiner—Marc S. Hoff
Attorney, Agent, or Firm—Lowe, Price, LeBlanc, Becker & Shur

[57] ABSTRACT

When a prescribed value of inner potential is provided from AC voltage received by an input terminal (1), first input means (30) and second input means (20) control gate voltages of first and second transistors (8) and (7), respectively, so that the inner potential may not be influenced by threshold voltage of these transistors.

6 Claims, 4 Drawing Sheets

INNER POTENTIAL GENERATING CIRCUIT

BACKGROUND OF THE INVENTION

1. Field of the Invention

The present invention relates to an inner potential generating circuit and particularly to a circuit for generating a potential of a substrate or the like in a semiconductor integrated circuit.

2. Description of the Prior Art

FIG. 1 is a circuit diagram showing a conventional inner potential generating circuit. The conventional circuit in FIG. 1 comprises: an input terminal 1 to which AC voltage is applied; a ground line 2 as a reference potential point, to which ground potential is applied in this case; a capacitor 3; an updown point 4 connected to the input terminal 1 through the capacitor 3 for generating a rising and falling potential; an output terminal 5 for generating an inner potential; a capacitive load 6 (including all the capacitive loads, from a standpoint of AC, connected between the output terminal 5 and the other constant potential points such as a power supply terminal although the capacitive load 6 shown in FIG. 1 is only connected between the output terminal 5 and the reference potential point 2); a first transistor 8 which is an n channel enhancement type insulated gate field effect transistor connected between the updown point 4 and the output terminal 5, the gate thereof being connected to the output terminal 5; and a second transistor 7 which is an n channel enhancement type insulated gate field effect transistor connected between the updown point 4 and the ground line 2, the gate thereof being connected to the updown point 4.

The conventional inner potential generating circuit thus constructed operates as shown in the timing chart in FIG. 2. Referring to FIG. 2, (a) represents a waveform of an AC voltage V1 supplied to the input terminal 1 and excited between a power supply potential $V_{DD}$ of about 5 V and the ground potential, and (b) represents waveforms of the potential V4 at the updown point 4 and the inner potential V5 at the output terminal 5 shown by the broken lines and the solid line, respectively. The respective abscissas in (a) and (b) of FIG. 2 commonly represent passage of time. FIG. 2 shows approximately two cycles of the AC voltage V1 with the inner potential V5 being in a transient state.

In FIG. 2, assuming that the conditions $V1=V_{DD}$ ($V_{DD}$ being the power supply potential of about 5 volts in the integrated circuit), $V4=V_{T2}>0$ volt ($V_{T2}$ being a threshold voltage of normally 0.6 volt in the second transistor 7) and $V5=V(n-1)<0$ volt are given immediately before the time t(n)0, V4 changes from $V_{T2}$ to $V_{T2}-V_{DD}$ if V1 changes from $V_{DD}$ to 0 volt at the time t(n)0. This is because the impedance values of the first and second transistors 8 and 7 are sufficiently large compared with the capacitor 3 from a standpoint of AC. At this time, since V5 is maintained to be $V5=V(n-1)<0$ volt, a voltage represented as $V5-V4=V(n-1)+V_{DD}-V_{T2}>0$ volt is applied to the first transistor 8 in the forward direction and electric current starts to flow from the capacitive load 6 to the updown point 4. As a result, V5 is further lowered and, to the contrary, V4 starts to rise from $V_{T2}-V_{DD}$. The changes of V4 and V5 are determined by the relation among the impedance values of the capacitor 3, the capacitive load 6 and the first transistor 8 as well as by the law of constancy of electric charge. When $V5-V4=V_{T1}$ ($V_{T1}$ being a threshold voltage of the first transistor 8), the electric current becomes 0 and thereafter constant values represented as $V5=V(n)<V(n-1)$ and $V4=V(n)+V_{T1}$ are maintained. Those conditions are established at the time t(n)1. If V1 changes from 0 volt to $V_{DD}$ at the time t(n)2, change is caused in the same manner as in the case of the time t(n)2 but in the direction opposite to that case, whereby $V4=V(n)+V_{T1}+V_{DD}>0$. At this time, a forward voltage $V(n)+V_{T1}+V_{DD}$ is applied to the second transistor 7 and electric current flows from the updown point 4 to the ground line 2. The subsequent change of V4 is determined by the relation of the impedance values of the capacitor 3 and the second transistor 7 in the same manner as described above. More specifically, at the time t(n)3, the electric current becomes 0 and the potential V4 becomes $V4=V_{T2}$, so that the constant value is maintained till the time t(n+1)0 for the next cycle. On the other hand, the potential V5 is unchanged in a period from the time t(n)1 to the time t(n+1)0.

If the law of constancy of electric charge is applied, that is if decrease in electric charge in the period from the time t(n)0 to the time t(n)1 corresponds to increase in electric charge at the updown point 4, the respective capacitance values C5 and C4 are expressed by the following equation.

$$(C4+C5)(V(n)+V_{DD}-V_{T1}-V_{T2})=C5(V(n-1)+V_{DD}-V_{T1}-V_{T2})$$

By using this equation, V(n) is expressed by the following equation assuming that V(0)=0.

$$V(n)=-(V_{DD}-V_{T1}-V_{T2})(1-(C5/(C3+C6))^n) \quad (1)$$

Since $C6/(C3+C6)<1$, it is understood that V(n) becomes $V(n)\rightarrow -(V_{DD}-V_{T1}-V_{T2})$ if n increases. Assuming that the cycle of the AC voltage V1 is T, transformation of $V(t)=V(n)$, $t=nT$ is made if the change of V5 by steps as described above is not taken into account, and the following result is obtained.

$$V(t)=-(V_{DD}-V_{T1}-V_{T2})(1-(C5/(C4+C5))^t) \quad (2)$$

Consequently, the inner potential V5 changes in a manner almost equal to V5(t) shown in FIG. 3.

Thus, the conventional inner potential generating circuit generates the inner potential existing on the outside of the area between the power supply potential $V_{DD}$ and the potential of the ground line 2 (the inner potential in this case being a finally attained value $-(V_{DD}-V_{T1}-V_{T2})$ which is lower than the ground potential).

In the above description, the periods required for changing V1 and V4 at t(n)0 and t(n)2 are assumed to be 0 for the purpose of facilitating the understanding. However, even if these periods are not 0, the operation is the same as described above if the impedance values of the first and second transistors 8 and 7 are sufficiently larger than the values of the capacitor 3 and the capacitive load 6. If the impedance values are not sufficiently large, the widths of change of V4 at t(n)0 and t(n)2 become smaller than $V_{DD}$ according to the impedance values. In addition, in a practically utilized circuit, although a parasitic capacitor exists between the updown point 4 and the ground line 2 (including a parasitic capacitor connected from a standpoint of AC), such a parasitic capacitor is not taken into account in the above description since the capacitance values C3 and C6 are sufficiently larger than the capacitance value of the parasitic capacitor. However, if such a parasitic capacitor is taken into account, the widths of change of V4 are further decreased compared with the above stated change widths.

As described above, in the conventional inner potential generating circuit, a difference in voltage between the finally attained value of the inner potential at the output terminal 5 and the ground potential is equal to a value obtained by subtracting the sum of the threshold voltages of the first and second transistors 8 and 7 from the amplitude of the AC voltage supplied to the input terminal 1. As a result, the circuit in FIG. 1 involves a disadvantage that the amplitude of the AC voltage cannot be utilized to the maximum at the time of generating the inner potential. In addition, in view of the manufacturing processes of semiconductor devices, it is difficult to control threshold voltage and irregularities in threshold voltage values are found, for example, among lots of fabrication, wafers in the same lot and chips in the same wafer, and in the area of the same chip. Accordingly, it is difficult in the conventional circuit to set the finally attained value of the inner potential to a desired value.

In order to overcome the above described disadvantages or difficulties, technique as disclosed in Japanese Patent Laying-Open Gazette No. 78165/1982 is proposed. However, according to the technique disclosed in this Gazette, influence of threshold voltage still remains in the inner potential although the influence of the threshold voltage can be lessened to a certain extent. Therefore, it cannot completely overcome the above described disadvantages.

SUMMARY OF THE INVENTION

The present invention has been accomplished to overcome the above described disadvantages and it is an object of the present invention to provide an inner potential generating circuit in which inner potential is obtained without being influenced by threshold voltage.

Briefly stated, in an inner potential generating circuit of the present invention, first and second input means control the ON, OFF states of first and second transistors respectively when the first transistor transfers electric charge from an output terminal to a predetermined point in the circuit and the second transistor further transfers the electric charge from the above stated predetermined point to a reference potential point. Thus, the inner potential in the normal state (the potential at the output terminal) never undergoes voltage drop due to the threshold voltages of the first and second transistors.

According to the present invention, influence of threshold voltage of transistors can be completely prevented from being exerted on an inner potential output in an inner potential generating circuit. Therefore, the present invention makes it possible to generate an inner potential utilizing the amplitude of AC voltage to the maximum and makes it easy to set a desired value of an inner potential output.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
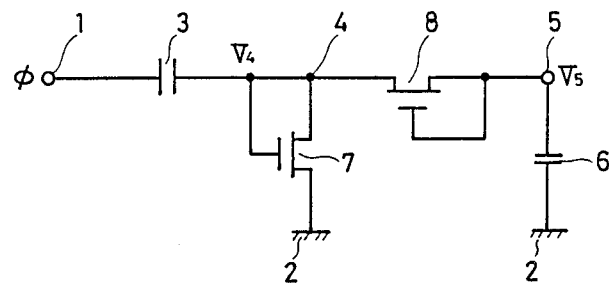
FIG. 1 is a circuit diagram showing a conventional inner potential generating circuit.
Figure 4:
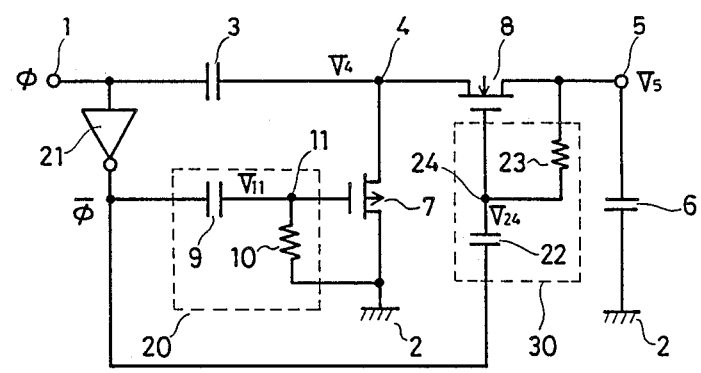
FIG. 4 is a circuit diagram showing an embodiment of the present invention.

FIG. 4 is a circuit diagram showing an embodiment of the present invention. This embodiment has the same construction as that of the conventional circuit shown in FIG. 1 except for the below described points and, therefore, the corresponding portions are denoted by the same reference numerals and description thereof is omitted. Referring to FIG. 4, this embodiment comprises circuit components 9 to 11 and 21 to 24 in addition to the circuit components 1 to 8 as described previously in connection with FIG. 1, although in this case the circuit component 7 is a p channel transistor. The circuit component 9 is a coupling capacitor, one end thereof receiving a voltage signal of a phase opposite to that of the AC voltage at the input terminal 1 and the other end thereof being connected with the gate of the second transistor 7. The circuit component 10 is a resistive impedance means having one end connected with the gate of the second transistor 7 and the other end connected with the ground line 2. In this embodiment, the resistive impedance means is a resistor formed of a polycrystal film of low impurity concentration or the like and having an extremely large resistance value. The circuit component 11 is a node between the coupling capacitor 9 and the resistive impedance means 10. The coupling capacitor 9 and the resistive impedance means 10 constitute second input means 20 for applying a potential from the node 11 to the gate of the second transistor 7. The circuit component 21 is an inverter circuit connected with the input terminal 1 for providing a voltage signal of a phase opposite to that of the AC voltage. The circuit component 22 is a coupling capacitor, one end thereof receiving the voltage signal of the phase opposite to that of the AC voltage at the input terminal 1 and the other end thereof being connected with the gate of the first transistor 8. The circuit component 23 is a resistive impedance means having one end connected with the output terminal 5 and the other end connected with the gate of the first transistor 8. In this embodiment, this resistive impedance means 23 is a resistor similar to the resistor 10. The circuit component 24 is a node between the coupling capacitor 22 and the resistance impedance means 23. The coupling capacitor 22 and the resistive impedance means 23 constitute first input means 30 for applying a potential from the node 24 to the gate of the first transistor 8. In this embodiment, a p channel enhancement type transistor is used as the second transistor 7 and an n channel enhancement type transistor is used as the first transistor 8.

Figure 2:
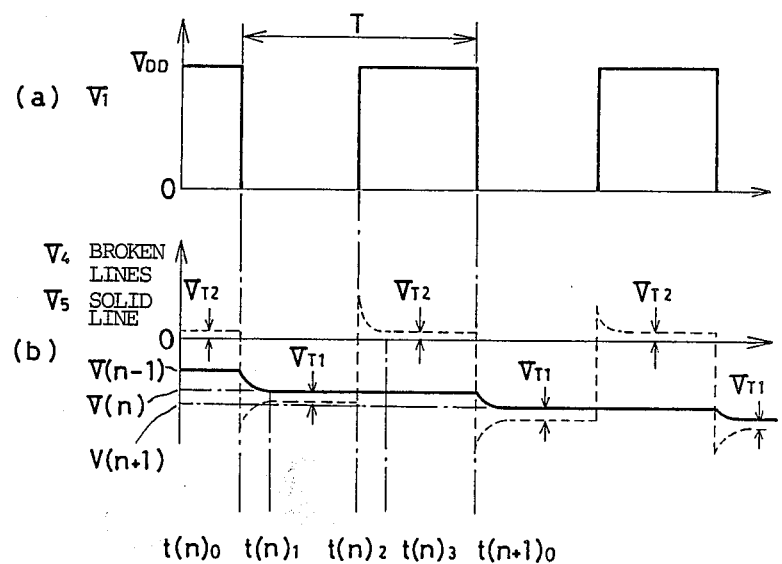
FIG. 2 is a timing chart showing a potential relation in various portions of the conventional inner potential generating circuit shown in FIG. 1.
Figure 3:
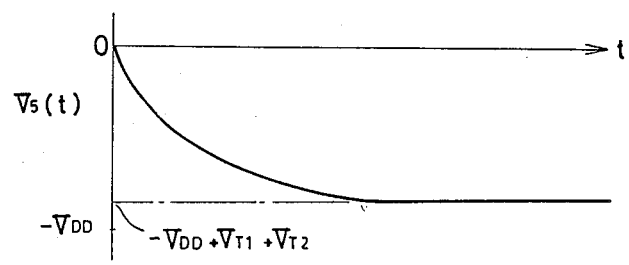
FIG. 3 is a graph showing a change in charging time for the inner potential of the conventional circuit shown in FIG. 1.
Figure 5:
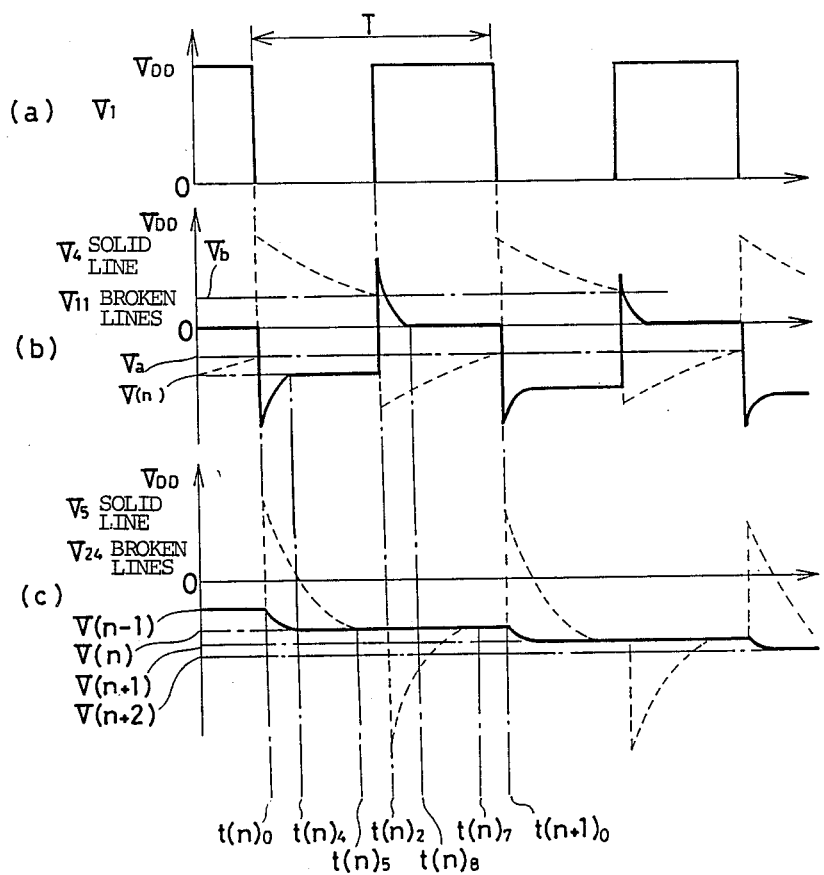
FIG. 5 is a timing chart showing a potential relation in various portions of the embodiment shown in FIG. 4.

The embodiment thus constructed operates in the following manner. FIG. 5 is a timing chart showing voltage signal waveforms of various portions in this embodiment. Particularly, (a) represents AC voltage V1 at the input terminal 1; the solid line in (b) represents potential V4 at the updown point 4; the broken lines in (b) represent potential V11 at the node 11; the solid line in (c) represents inner potential V5 at the output terminal 5; and the broken lines in (c) represent potential V24 at the node 24. The respective abscissas commonly represent passage of time and in the same manner as in FIG. 2, FIG. 5 shows approximately two cycles, namely, the (n)th cycle and the (n+1)th cycle of the AC voltage, and some portion around these cycles.

In the following, one cycle corresponding to the (n)th cycle will be described.

It is assumed that the conditions $V1=V_{DD}$, $V4=0$ volt, $V11=Va<0$ volt, $V5=V(n-1)<0$ volt and $V24=V(n-1)$ are given immediately before the time $t(n)0$. If V1 changes to 0 volt at the time $t(n)0$, V4 is lowered to $-V_{DD}$ and V11 and V24 rise to $Va+V_{DD}$ and $V(n-1)+V_{DD}$, respectively, for the same reason as described above in connection with the conventional circuit. Since V5 is maintained to be the initial value, the first transistor 8 is conducted and electric current begins to flow from the output terminal 5 to the updown point 4. If a time constant determined by the coupling capacitor 22 and the resister 23 is selected to be a suitable value, the gate voltage of the first transistor 8 can be maintained to be a value larger than $V_{T1}$, namely, $V24-V5>V_{T1}$ till the relation $V5=V4=V(n)$ is established, while in the conventional circuit, the electric current becomes 0 when $V5-V4=V_{T1}$. After that, when V4 and V5 become equal, the potentials V4 and V5 are maintained unchanged. Assuming that $V5-V4=0$ at the time $t(n)4$, the gate voltage of the first transistor 8 at that time is equal to a difference between V24 and V5 at the time $t(n)4$ in (c) of FIG. 5. V24 becomes equal to V5 at the time $t(n)5$ determined by the previously stated time constant and V24 is maintained constant. During this period, the second transistor 7 is always in the off state since the time constant based on the coupling capacitor 9 and the capacitive load 10 is determined so that the gate voltage of the second transistor 7 is $V11-V4 \geq V_{T2}<0$ volt. If V1 changes to $V_{DD}$ at the time $t(n)2$, V4 and V11 change to $V(n)+V_{DD}$ and $Vb-V_{DD}$, respectively, and, on the other hand, V24 changes to $V(n)-V_{DD}$. At this time, the first transistor 8 is in the off state since the gate voltage thereof is $V24-V5<0<V_{T1}$. Thereafter, the first transistor 8 is maintained to be in the off state even after V24 is returned to V(n) according to the time constant determined by the coupling capacitor 22 and the resistor 23. Consequently, V5 is kept unchanged thereafter till the time $t(n+1)0$, and V24 is also unchanged after it has become V(n). (At the time $t(n)7$, the value of V24 changes from $V24<V5$ to $V24=V5$.) On the other hand, the second transistor 7 is set so that $V11-V4=(Vb-V_{DD})-(V_{DD}-V(n))=Vb+V(n)-2V_{DD}<V_{T2}<0$. Accordingly, electric current begins to flow from the updown point 4 to the ground line 2. If the time constant determined by the coupling capacitor 9 and the resister 10 is sufficiently large in the same manner as in the first transistor 8 in the on state, $V11<V_{T2}<0$ can be maintained till the time $t(n)8$ when $V4=0$ volt. In this embodiment, the time $t(n)2$ comes before $V11=0$ volt, and V11 at the time $t(n)2$ is $Va<0$ volt. Thereafter, V4 and V11 are both kept unchanged till the time $t(n+1)0$.

The above described relation is established irrespective of the integer n and if the same processing as in the conventional circuit is performed by applying the law of constancy of electric charge to the change of potential during the period from the time $t(n)0$ to the time $t(n)4$, the below indicated equation (3) is obtained. This equation (3) indicates that voltage drop due to threshold voltage does not occur, as is different from the case of the conventional circuit.

$$V5(n) = -V_{DD}(1-(C6/(C3+C6))^n) \quad (3)$$

An equation corresponding to the equation (2) in the conventional circuit is obtained as follows.

$$V5(t) = -V_{DD}(1-(C6/(C3+C6))^t) \quad (4)$$

Figure 6:
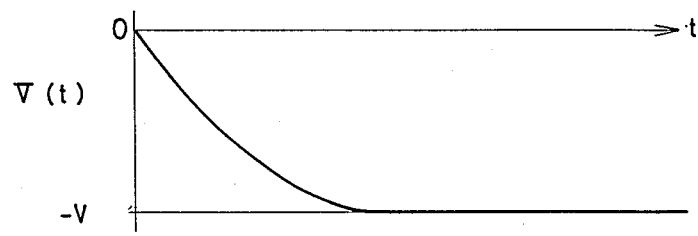
FIG. 6 is a graph showing a change in charging time for the inner potential of the embodiment shown in FIG. 4.

The equation (4) is shown in FIG. 6.

As is clearly understood from the above description, the previously described disadvantages can be overcome since the finally attained value of the inner potential provided at the output terminal 5 is obtained without causing voltage drop due to threshold voltage.

Figure 7:
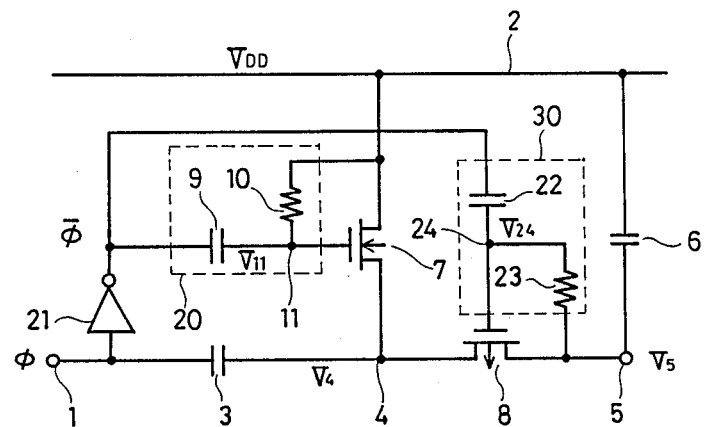
FIG. 7 is a circuit diagram showing another embodiment of the present invention.

If, instead of the above described embodiment shown in FIG. 4, another construction as shown in FIG. 7 is applied in which the plus and minus of all the potential relations and the channel types of the two transistors 7 and 8 are reversed, a potential higher by $V_{DD}$ than the potential $V_{DD}$ at the power supply potential point 2 is obtained at the output terminal 5.

In addition, although the place from which the AC voltage at the input terminal 1 is applied is not clearly indicated in the above described embodiment, the AC voltage may be supplied from the main circuit to which the inner potential generating circuit is connected or from other external portions, for example, from outside the substrate where the inner potential generating circuit and the main circuit are formed as an integrated circuit.

Although the AC voltage is excited between 0 volt and $V_{DD}$ in the above described embodiment, it goes without saying that the present invention is not limited thereto if the potential difference is the same.

In the above described embodiment, the amplitude of excitation of the AC voltage is applied between 0 volt and $V_{DD}$ corresponding to the power supply voltage of the main circuit or the like in the same chip and this amplitude is not influenced by threshold voltage of transistors included in a ring oscillator etc. in an AC voltage generating circuit. However, the present invention may be applied to the case in which voltage drop due to the threshold voltage $V_T$ is caused in the AC voltage, namely, the amplitude of excitaiton of the AC voltage is $V_{DD}-V_T$. In this case, the influence of the threshold voltage exerted on the AC voltage extends to the output of the inner potential generating circuit. However, the influence of the threshold voltage can be prevented from being extended in the inner potential generating circuit because the first and second transistors 8 and 7 are not influenced by the threshold voltage. Further, the inner potential generating circuit is capable of generating an inner potential utilizing the amplitude $V_{DD}-V_T$ of the AC voltage to the maximum.

Figure 8:
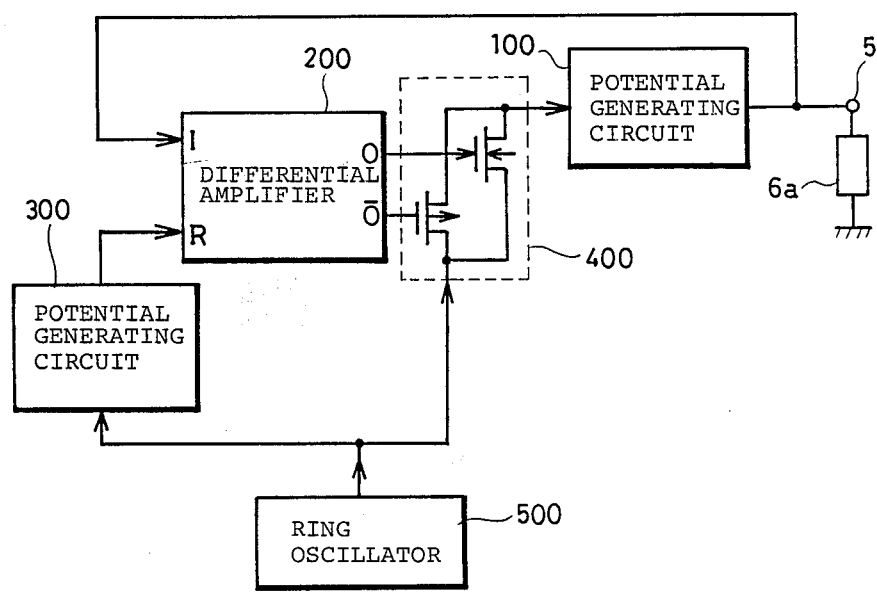
FIG. 8 is a block diagram showing an example of application of the present invention.

In the above description, the inner potential necessary for the main circuit to which the inner potential generating circuit is connected is directly supplied to the main circuit. In view of the meritorious effect of the above described embodiment that an inner potential almost equal to a design value can be obtained, the following example of application may be considered. FIG. 8 is a block diagram showing the example of application in which a potential generating circuit of the present invention is used as a reference voltage generating circuit for comparison. Referring to FIG. 8, a potential is applied to a load 6a where electric current flows in reality, by means of a potential generating circuit 100 having high driving power, which may be the circuit in FIG. 4 or the circuit in FIG. 1. When the potential at the output terminal 5 exceeds a prescribed inner potential, the potential generating circuit 100 stops application of the AC voltage. More specifically, the potential at the output terminal 5 is applied to a signal input terminal I of a differential amplifier 200 and the prescribed inner potential provided by the potential generating circuit 300 as shown in FIG. 4 is applied to a comparison input terminal R. If the potential applied to the signal input terminal I does not exceeds the prescribed inner potential applied to the comparison input terminal R, a transfer gate 400 (a p and n channel transistors in this case) is conducted. If the former exceeds the latter, the transfer gate 400 is cut off. Thus, application of the AC voltage from the ring oscillator 500 to the potential generating circuit 100 is controlled. Although the potential generating circuit 300 receives the AC voltage from the ring oscillator 500 in FIG. 9, the potential generating circuit 300 may receive the AC voltage from other portion. In addition, although the output of the AC voltage generating circuit 300 is directly supplied to the differential amplifier 200, a signal obtained by dividing the output of the AC voltage generating circuit 300 through a resistor may be supplied thereto.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An inner potential generating circuit for generating a predetermined constant value of DC voltage based on an AC voltage of rectangular waveform, comprising:
    an input terminal to which said AC voltage of a rectangular waveform is applied,
    an output terminal for providing said constant DC voltage;
    a capacitor and first transistor connected in series between said input terminal and said output terminal;
    a node interconnecting said capacitor and said first transistor, a potential on the node rising or falling according to a change in said AC voltage;
    a constant reference potential source;
    a second transistor connected between said node and said reference potential source;
    first input means for (a) turning said first transistor on in response to a first transition of said rectangular waveform to a first magnitude and off when a potential on said node reaches a potential of said output terminal, (b) maintaining said first transistor on until a potential of said node is substantially the same as a potential of said output terminal, and (c) maintaining said first transistor off during an interval from a second transition of said rectangular waveform to a second magnitude until the next transition of said rectangular waveform to the first magnitude; and
    second input means for (a) turning said second transistor on when said second transition of said rectangular waveform to said second magnitude occurs, (b) maintaining said second transistor on until the potential of said node is substantially the same as the potential of said reference potential source, and (c) maintaining said second transistor off during an interval from said first transition of said rectangular waveform to said second magnitude until said second transition of said rectangular waveform to said second magnitude.

2. An inner potential generating circuit in accordance with claim 1, wherein
    said first input means comprises a first time constant circuit for controlling a base voltage of said first transistor, and
    said second input means comprises a second time constant circuit for controlling a base voltage of said second transistor.

3. An inner potential generating circuit in accordance with claim 2, wherein
    said first time constant circuit comprises:
    a capacitor having one end connected to said input terminal through an invertor circuit and another end connected to the gate of said first transistor, and
    a resistor having one end connected to the gate of said first transistor and another end connected to said output terminal,
    said second time constant circuit comprises:
    a capacitor having one end connected to said input terminal through said invertor circuit and another end connected to the gate of said second transistor, and
    a resistor having one end connected to the gate of said second transistor and another end connected to said reference potential source.

4. An inner potential generating circuit in accordance with claim 3, wherein
    said reference potential source is at a ground potential.

5. An inner potential generating circuit in accordance with claim 3, wherein
    said reference potential source is at a power supply potential.

6. An inner potential generating circuit in accordance with claim 1, wherein
    said AC voltage of rectangular waveform applied to said input terminal does not involve voltage drop due to threshold voltage of any transistor.

* * * * *